July 28, 1970 R. LACAL 3,522,087

SEMICONDUCTOR DEVICE CONTACT LAYERS

Filed Feb. 9, 1967 3 Sheets-Sheet 1

INVENTOR.
RODOLPHE LACAL
BY
AGENT

INVENTOR.
RODOLPHE LACAL
BY
[signature]
AGENT

SEMICONDUCTOR DEVICE CONTACT LAYERS

Filed Feb. 9, 1967 3 Sheets-Sheet 3

INVENTOR.
RODOLPHE LACAL
BY
[signature]
AGENT

United States Patent Office 3,522,087
Patented July 28, 1970

3,522,087

SEMICONDUCTOR DEVICE CONTACT LAYERS

Rodolphe Lacal, Calvados, France, assignor, by mesne assignments, to U.S. Philips Corporation, New York, N.Y., a corporation of Delaware Filed Feb. 9, 1967, Ser. No. 615,004
Claims priority, application France, Feb. 16, 1966, 49,866
Int. Cl. H01l 3/00, 5/00
U.S. Cl. 117—227 6 Claims

ABSTRACT OF THE DISCLOSURE

A method for making contact to a semiconductor or for bonding the semiconductor to a substrate, and the contact material and end product, wherein the contact layer is formed by simultaneously depositing on a substrate, electrolytically or by a vapor process, a metal and fine semiconductor particles which become dispersed throughout the layer, which is carried out at a temperature below the alloying temperature of the metal and the semiconductor.

This invention relates to methods of manufacturing contact layers for semiconductor devices, such as transistors or diodes, and to contact layers or semiconductor devices manufactured by such methods. A layer of this kind, which may constitute an electrical connection or not, may serve more particularly to bond as by soldering or brazing or alloying a semiconductor body on a substrate or to form a contact on a discrete part, for example on an emitter region, a base region, or a collector region of such a body.

It has previously been suggested to form contact layers of an alloy consisting of a metal constituting, for example, a significant impurity, such as indium, and a semiconductor material such as germanium (see British patent specifictaion No. 740,655). When using such an alloy as a contact layer it is possible to avoid that, when this layer is alloyed on a semiconductor body of the same kind, an excessive amount of semiconductor material constituting the body is dissolved in the contact layer. In other words, when using such contact layers, the depth of penetration thereof in the semiconductor body is reduced.

Also, it has previously been suggested to obtain a contact layer from a gold alloy having a small content of germanium or silicon, which alloy affords the advantage of having a comparatively low melting point and satisfactory adhesion, as well as a low depth of penetration. However, such alloys suffer from the disadvantage that they are very brittle and difficult to process (see British patent specification No. 809,877).

Further it has previously been suggested to apply metallic contact layers such as gold to a substrate by electroplating by applying at the same time, likewise by electroplating, a dope such as antimony. In this case, a soluble salt of antimony e.g. antimony hydrochloride, $SbCl_3$ may be used (see U.S. patent specification No. 2,796,563 and British patent specification No. 833,828). This method is in general unsuitable for the simultaneous deposition of semiconductor material such as silicon or germanium.

An object of the invention is to obviate these disadvantages. It is based on the idea that in many cases it is not necessary for the contact layer to be constituted by an alloy before being alloyed on part of the semiconductor device, more particularly on the semiconductor body, and that it is often even unnecessary that, after deposition and fusion, the contact layer alloys. It is also based on the idea that alloys of a metal and a semiconductor material often have unfavourable mechanical properties.

More particularly they are very brittle while, taken separately, the metal, which forms the major part, is ductile. It is also recognized that, since the amount of semiconductor material which is desired to incorporate in the contact layer is often so small relative to the amount of metal that, once combined efficaciously without being alloyed, the semiconductor material and the metal may afford special advantages, such as improved mechanical properties.

According to the invention a contact layer of this kind is obtained by applying the metal to a substrate so as to form a coherent layer, whilst during this process particles of a semiconductor material able to alloy with the metal are also simultaneously deposited at a temperature lower than that at which the metal and the semiconductor material alloy together so that the particles of semiconductor material are included, at least in part, in the metal deposited. It should be noted that it is not essential to the invention that the complete contact layer is formed by the simultaneous deposition of metal and semiconductor material. Thus, it is possible first to apply, for example, a thin layer of metal, followed by the simultaneous deposition of metal and semiconductor material. Thereafter pure metal could again be applied.

In one embodiment of the invention the contact layer is heated to a temperature at which the metal and the semiconductor material alloy together after having been brought into mechanical contact with another part of the semiconductor device in order to obtain between said two parts a good electrical and/or thermal contact by fusion of said contact layer. It is also possible though unnecessary to form the alloy on the substrate by heating before the substrate is brought into mechanical contact with said other part of the semiconductor device.

The metal is preferably applied by electro-deposition since this method permits of obtaining very pure metallic layers and since it is not complicated to apply simultaneously other particles, more particularly non-metallic particles. In this case, semiconductor particles partake the nature of non-metallic particles. Methods of this kind, in which a so-called "external" electrical field is used, are known and used more particularly for the manufacture of layers resistant to wear, self-lubricating, or layers which satisfy particular requirements in the artistic field (see, for example, Tomaszewski, Clauss and Brown, "Proceedings American Electroplaters' Society," vol. 50 (1963) pages 169 to 174). In this case the occurrence of electrophoresis effects may also assist in the depositions of the particles of semiconductor material but the invention must not be regarded to be bound to the truth of this hypothesis.

It is also possible to apply the metal by a chemical process by using so-called "electroless" deposition, that is to say an electro-deposition method in which no external electrical field at all is used. Such processes, also referred to as "Brenner" processes, are notably described by Brenner and Riddel in "Proceedings American Electroplaters' Society," vol. 33 (1946), pages 23 to 33 and vol. 34 (1947), pages 156 to 170.

Further, the metal may also be applied to the substrate in the dry state, notably by evaporation or cathodic atomisation.

Gravitation may also assist in the deposition of the particles of semiconductor material, more particularly if the metal is applied without using an external electrical field. This opens a possibility of a preferential deposition of the semiconductor particles, which, through gravitation, will settle preferentially on horizontal surfaces whereas the metal, applied by the "electroless" method will be deposited equally on all surfaces. If the metallic layer is applied with the use of an external electrical field the influence of gravity on the semiconductor particles is in general almost negligible.

The substrate to which the contact layer is applied may be constituted by a metal or an alloy, preferably a metal or an alloy having a thermal coefficient of expansion corresponding to the coefficients of expansion of usual semiconductor bodies, such as germanium and silicon. Substrates of tungsten, molybdenum and "Fernico" (trade mark of an alloy constituted by 54% by weight of iron, 28% by weight of nickel and 18% by weight of cobalt) are very suitable. Further suitable substrates are more particularly those of nickel, of alloys of nickel and iron, or of ceramic material such as alumina.

However, the substrate to which the contact layer is applied may alternatively be constituted by a semiconductor body. Said layer may be applied more particularly to the surface of such a body which is intended to be soldered on a carrier or a header. The contact layer may also be applied only over a very small part of a surface of such a body, for example in a window formed in an insulating layer, more particularly in an oxide layer covering said surface. It is thus possible to form the planar electrodes of transistors and diodes by heating the layer after the deposition and alloying it on the semiconductor body, the presence of semicondctor material in the layer causing in known manner a reduction of the melting point and also preventing the semiconductor material constituting the body from being dissolved in the electrode to an excessive amount, that is to say that the depth of penetration of the electrode is not too great. In this case, it is an advantage, that the semiconductor particles may be incorporated in the metal of the electrode without application of high temperature or mechanical forces which might be detrimental to the properties of the device.

It is to be noted that, when in this description reference is made to deposition of a contact layer on a semiconductor or a ceramic body, this may also be a body on which another thin layer is already present. This layer may notably be a thin metallic layer which may serve to improve the adhesion, for example a gold or a nickel layer preliminarily evaporated on the body on which it is baked by heating.

Although, in general, the contact layer is bonded permanently on the substrate, in another embodiment of the invention it may be applied to a provisional substrate, from which it is subsequently separately as a foil. This foil may then be processed by rolling, cutting, punching or similar mechanical processes. In this case the advantage constituted by the fact that the ductility of the foil is primarily determined by the metal present in the contact layer may particularly become manifest. The undesirable mechanical properties of the alloy begin to play a part only when the said foil is fused, for example, during the alloying on a semiconductor body.

The metal applied is preferably gold or silver and the applied particles of semiconductor material are preferably of silicon or germanium.

The metal and the semiconductor material are preferably chosen so that they may, in combination, form a distinctly characterized eutectic, which is the case with the aforementioned elements. Other metals may be used with the said semiconductors, more particularly aluminium, cobalt and nickel, which likewise form eutectics with germanium and silicon.

However, the invention is not limited to said elements. The semiconductor material need not necessarily be an elementary semiconductor such as silicon or germanium and it is also possible to use semiconductor compounds such as gallium arsenide, more particularly in contact layers alloyed on bodies constituted by the same compound.

The particles of semiconductor material may be very small but it is not necessary to reduce them so as to remain, for example, constantly dispersed in a galvanic bath. In fact, when using larger particles, they may be maintained suspended by stirring of the bath. Furthermore, larger particles are less sensitive to chemical influences from the surroundings.

The size of the particles is preferably less than 5 microns and even smaller than 1 micron the greater proportion thereof being in general much smaller.

It is usually advantageous if the amount of semiconductor material incorporated in the deposited metallic layer is less than, or at most equal to, the amount corresponding to the formation of the eutectic considered.

Thus, the amount may very between wide limits. As will be discussed later, the amount may be so small that though the larger particles of semiconductor material incorporated in the layer may be visible through a microscope at moderate magnification, e.g. 500×, still the amount will be too small to be detected by analytical means such as spectroscopic analysis.

In general the layer should contain at least 0.001% by volume of semiconductor material, but preferably at least 0.01% by volume in order that the main advantages of the invention may be realized. However, much larger amounts such as corresponding to the formation of a completely eutectic layer should be considered also. Also, the thickness of the layer is not critical, and will in general be much thinner than either the substrate or the semiconductor body to be bonded thereto. The same thicknesses as used in the prior art layers of the metal alone are suitable.

It is common practice in the semiconductor technique to add very small amounts of doping elements to semiconductor materials and also to metals constituting contacts or contact layers. Whenever reference has been made hereinbefore to semiconductor materials or metals, the presence of such doping elements is not excluded, and to include a doping element, a salt of the dopant may be included in the bath.

The invention further simplifies the addition of such doping elements to the contact layer by adding them to the metal being deposited and/or to the semiconductor material. Boron is, for example, an element which alloys with metals with difficulty. In another embodiment of the invention silicon doped with boron is deposited, by providing boron-doped silicon particles in the bath.

The doped particles of semiconductor material which are added, in accordance with the invention, to metals may originate more particularly from the residues of ingots having served for the manufacture of semiconductor devices, or the slurry or waste obtained in slicing semiconductor rods into wafers. Thus, the method according to the invention permits of using again scrap material originating from other manufactures of semiconductor devices. This is the more advantageous as these residues of doped ingots, except those of germanium, cannot readily be purified for renewed use. This is notably also the case with residues of silicon ingots.

The contact layer according to the invention is preferably alloyed on a semiconductor body of the same kind as the semiconductor particles included in the said layer.

The invention also relates to semiconductor devices, substrates or supports of semiconductor bodies and to thin layers or parts of thin layers obtained by the methods above described.

In order that the invention may be readily carried into effect, it will now be described in detail, by way of example, with reference to the accompanying diagrammatic drawings, in which.

Figure 1:
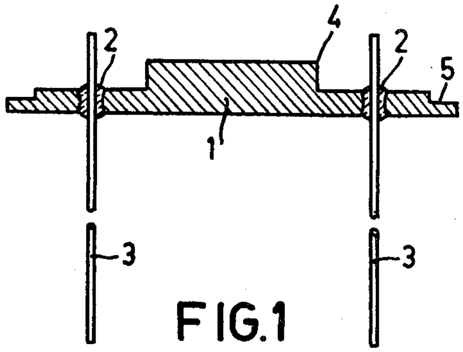
FIG. 1 is a sectional view of a base or support of a semiconductor device.

As the first example, a description follows of the method of applying a contact layer to the base of a semiconductor device intended to support the crystal of this device. The header (FIG. 1) comprises a nickel disc 1 through which pass a certain number of conductors 3 sealed in apertures by means of glass beads 2. The upper face comprises an elevated part 4 on which the semiconductor body may be bonded. A cap (not shown) may be soldered to the edge 5.

Figure 2:
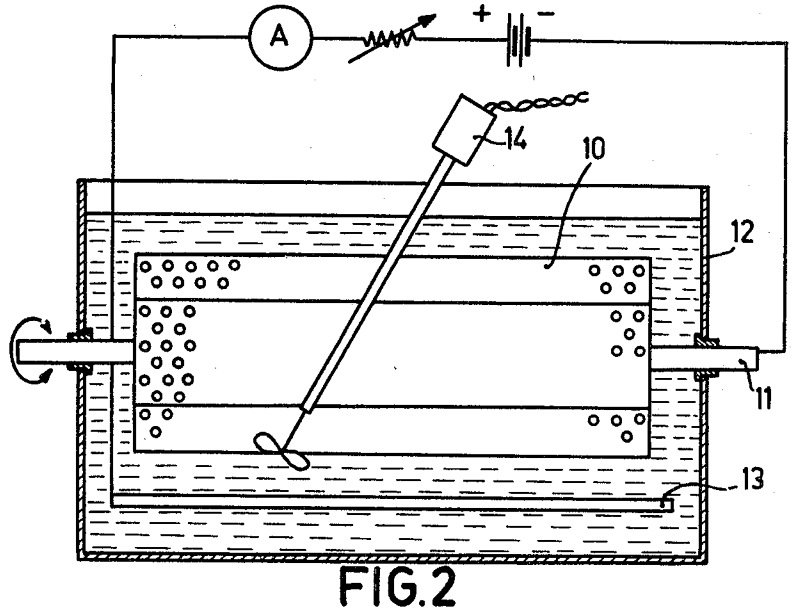
FIG. 2 is a sectional view of a device serving to apply by electro-deposition contact layers to small objects, more particularly the base of FIG. 1.

A certain number of these headers (FIG. 2) are placed in an electroplating tank, for example in a perforated hexagonal drum 10 of insulating material, rotating about a horizontal shaft 11, in a vessel 12. Below in the vessel is an anode 13 and the cathode connection penetrates through the shaft 11 into the drum 10. The driving device for the drum is not shown. The drum preferably rotates alternately in one direction and in the opposite direction in order to prevent the conductors 3 from becoming entangled. The continuously-employed plating tank may advantageously be provided with a stirring device 14 which serves to maintain the particles of semiconductor material suspended.

The invention imposes no particular requirement on the composition of the electrolyte, except that it must not untimely react with the particles of semiconductor material to be dispersed in it. Considering the multitude of baths or electrolytes used in electroplating and the number of adequate semiconductor materials, there will be no difficulty encountered in choosing suitable electrolytes and semiconductor materials for carrying out the deposition. In principle, use may be made of the usual electrolytes, but one should preliminarily as certain by experiment that the suspended semiconductor material is not attacked, at least not strongly, for the duration of the process of deposition.

In order that the base shown in FIG. 1 may be covered with a gold layer it is possible, for example, to choose the following illustrative bath containing per litre of water:

| | G. |
|---|---|
| Ammonium citrate $(NH_4)_2C_6H_6O_7$ | 100 |
| Gold-potassium cyanide $((CN)_2Au)K$(68% Au) | 14 |
| Pulverulent silicon | 0.5 |

With the exception of the added silicon, the bath is otherwise a standard one.

The temperature of this bath is advantageously 60° C. and the current strength is from 500 to 800 ma./dm.$^2$.

It is advantageous to grind the particles of semiconductor material for several hours in a ball mill, for example of agate, containing preferably a small quantity of the electrolyte used further.

The dimensions of the majority of the particles are less than the thickness of 6 microns provided for the contact layer to be deposited. For example, the average particle size may be about 1 micron. However, the presence of particles of a size somewhat larger than the thickness of the layer has not caused any difficulty.

As far as the current strength is concerned, it should be noted that with the aforementioned bath and in the absence of suspended silicon particles, a value of 200 ma./dm.$^2$ is usual and that it is dangerous to use higher current strength because "burning" phenomena of the deposited layer may then occur.

It has been found that the presence of suspended particles permits of using without objection higher current strength even such that for a current strength of 800 ma./dm.$^2$ still no burning phenomenon is produced.

Figure 3:
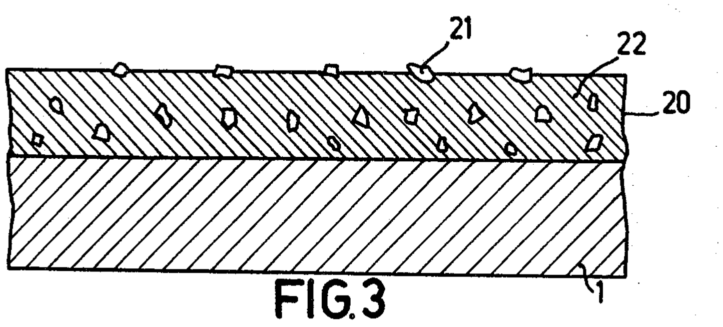
FIG. 3 shows a contact layer applied to a substrate.

In a contact layer 20 according to the invention of which FIG. 3 is a sectional view, the thickest silicon particle inclusions 21 may be made visible by a microscopic magnification not exceeding 130 (linear magnification). They are for the greater part included in a gold layer 22 which is present on the substrate 1. As indicated above, the layer 22 may have, for example, a thickness of 6 microns, though thinner layers, such as having a thickness of 3 microns, are also quite suitable.

Figure 4:
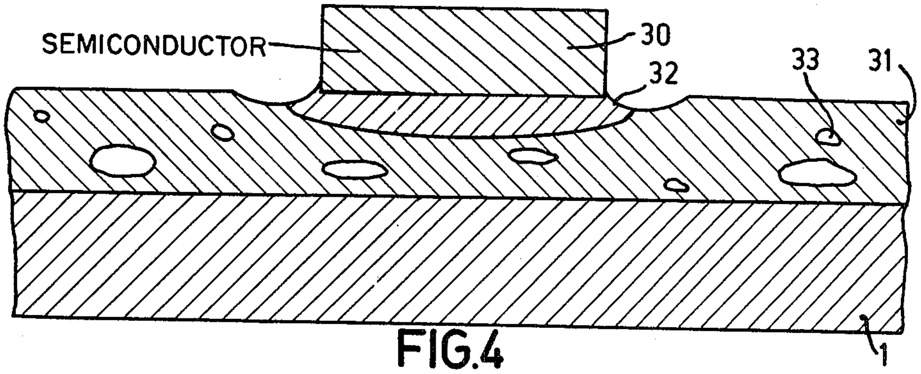
FIG. 4 is a sectional view of a semiconductor body bonded on a contact layer.

A silicon crystal body 30 as shown in FIG. 4 is alloyed on the contact layer. The details of this body, which may be for example a diode, a transistor or an integrated circuit, are not essential to the invention. The assembly comprising the base, the contact layer and the semiconductor body is heated to 410° C. in a non-oxidizing or reducing atmosphere for several seconds; the period of heating and the temperature are not critical provided the base reaches a temperature slightly higher than the eutectic temperature. The temperature used is advantageously situated approximately 40° C. above the eutectic point of gold and silicon. This difference is small in comparison with the difference of 155° C. to 190° C. which is encountered when, in a known method, a silicon body is alloyed at a temperature of from 525° C. to 560° C. with the aid of an eutectic alloy of gold and silicon prepared beforehand.

One of the criteria of a good connection is the satisfactory transmission of the heat developed in the crystal towards the substrate. It has been found that the transmission of heat tends to be improved and regulated in the device made by the method according to the invention. Moreover, the quality of the soldered or brazed bond between the crystal and the base is superior to that of gold alone. Excellent electrical contacts are obtained with low thermal resistance.

The possibility of connecting or assembling semiconductor bodies by fusion at comparatively low temperatures constitutes in numerous cases an important advantage considering that the risk of harmful influences on the body and on the structures which it comprises is thus reduced. The reason why it is possible to work at such low temperatures cannot be explained implicitly but the following considerations may have a certain importance in this respect.

When a semiconductor body is alloyed on a contact layer the body and the layer, never being perfectly plane, initially contact only in three points. The formation of an alloy of the body and the layer is effected progressively from these points, which takes a certain time and, if one does not want to work slowly, a comparatively high temperature. With the use of a method according to the invention, which method therefore might be called "dispersion bonding," the formation of an alloy does not commence in three or a small number of points, but is effected simultaneously at as many areas where the particles of semiconductor material are dispersed in the layer. Of course, especially those particles, which are situated under the semiconductor body to be bonded on the contact layer or situated in very close relation thereto will contribute to the improved bonding. This will also explain the fact that a marked improvement of the bonding process has been obtained with layers in which the content of semiconductor particles dispersed in the metal was much lower than that which would be required to achieve a conversion of the whole layer in an eutectic alloy.

Figure 5:
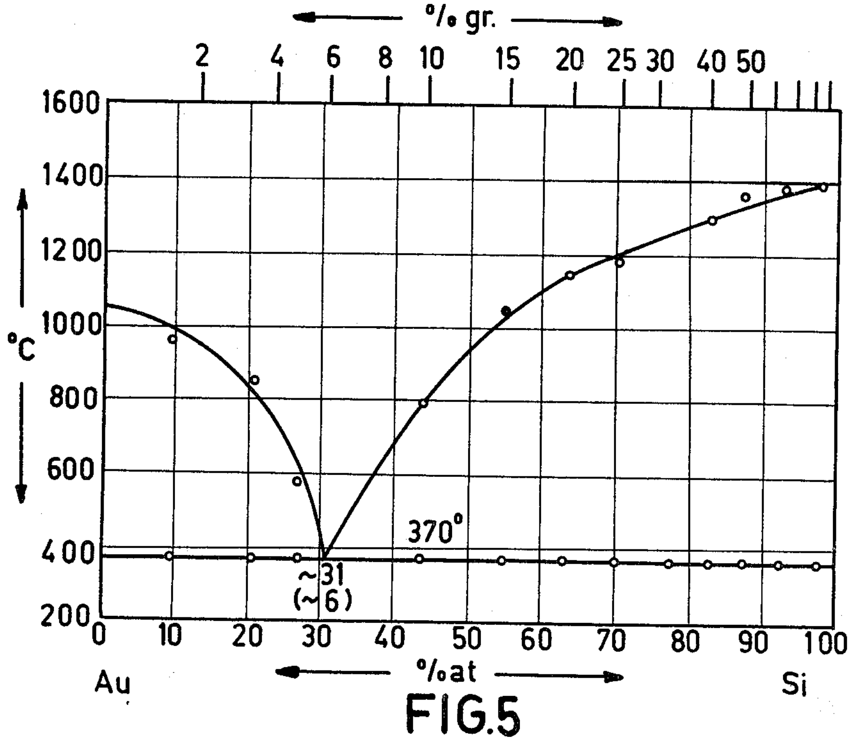
FIG. 5 shows the phase diagram of gold and silicon.

If a body of silicon is bonded in known manner on a substrate covered with gold, with the aid of an alloy of gold and silicon, it is easily achieved that the alloy commences to fuse at the eutectic point, that is to say at 370° C. Now, as soon as this alloy commences to mix by fusion with the silicon on the one hand and with the gold on the other, the melting point of the alloy thus formed rises rapidly so that high temperatures must be used to ensure fusion throughout the surface. The phase diagram shown in FIG. 5 and taken from the work by Hansen entitled "Constitution of Binary Alloys," New York, 1958, page 232, shows the rapid rise of these melting points.

If, on the other hand, the contact layer is constituted by a metal containing particles of semiconductor material which thus will alloy with the said metal, this alloy could have a tendency to occur only above the eutectic point and then to be produced in a rapid and easy manner.

When examining through a microscope a section of the product obtained, one will find in the contact layer 31 (FIG. 4), in addition to the usual recrystallized region 32, inclusions 33 which may be silicon, eutectic of gold and silicon, or small islands of alloy of gold and silicon having a composition different from that of the eutectic, both beneath the semiconductor body and at the side thereof. The size of these inclusions 33 may depend not only upon the size of the silicon particles deposited, but also upon other factors, for example conditions of heating and cooling. Such inclusions may also occur when a semiconductor body is alloyed on a contact layer constituted only by metal, but they are present exclusively beneath the body and in direct proximity thereof. In a semiconductor device obtained in accordance with this example of the method of the invention the semiconductor material in the form of inclusions or not would be found distributed throughout the contact layer not only in the proximity of the body 30 but throughout the surface of the disc 1 and even on the conductors 3 (FIG. 1). Particles of semiconductor material or eutectic are usually found in the layer even after heating above the eutectic point. However, the deposition of semiconductor particles may be avoided, for example by local masking, at the areas where it could be interfering, for example, on the edge 5 (FIG. 1).

If the contact layer is applied by electro-deposition with the aid of an external electric field, which is the case in the present example, the particles of semiconductor material are applied wholly or in part due to electrophoresis phenomena. As has been mentioned above, the metal of the contact layer may be applied without using an external field, by methods of chemical deposition. A contact layer containing silicon may thus be obtained using baths as described by Minjer and Brenner in their article published in "Plating," vol. 44, December 1957, pages 1297 to 1305, particles of silicon being added to said baths. Use may be made of, for example, a bath the temperature of which is comprised between 95° C. and 100° C. and which contains per litre of water:

| | G. |
|---|---|
| Nickel chloride ($NiCl_2.6H_2O$) | 30 |
| Sodium phosphate ($NaH_2PO_2.H_2O$) | 10 |
| Hydroxy-acetic acid ($HOCH_2COOH$) | 25 |
| Pulverulent suspended silicon | 1 |

In these cases electrophoresis effects cannot be expected. Consequently, the particles of semiconductor material preferably deposit on horizontal surfaces. This may be an advantage in cases where their presence on other surfaces is undesirable. It will be evident that, if electro-deposition is effected with the use of an external electrical field, it is possible to determine the operating conditions, that is to say the positioning of the electrodes and the substrate, and the direction of the field, in such manner that the deposition preferably takes place on a determined surface. This preference applies to both the metal and the particles of semiconductor material. It will be evident that it is possible to use successively a method utilizing an external electrical field and a method without an external electrical field, or conversely.

The application of contact layers by electrodeposition for the manufacture of semiconductor devices affords the advantage that the layer obtained has a high degree of purity and that the method is carried out at a comparatively low temperature. In addition, the method according to the invention may be carried out in numerous cases with the aid of existing apparatus, because it suffices to add to usual galvanic baths a suitable quantity of semiconductor material in the form of powder maintained in suspension. Moreover, this method affords the advantage that the distribution of the semiconductor particles throughout the metal layer may be controlled easily and effectively.

If it is desired to deposit particles of a semiconductor material which is not stable enough in galvanic baths such as aluminium phosphide and aluminium arsenide, the metal may be deposited, preferably in the dry state, for example by evaporation or by cathodic atomisation, whilst particles of semiconductor material are caused to deposit simultaneously or intermittently, for example by gravitation, on the metal layer formed or being formed.

A contact layer according to the invention may also be deposited on a semiconductor body. This may be effected by a method which differs only very slightly from the known method for the application of layers of a single material applied by electro-deposition.

Figure 6:
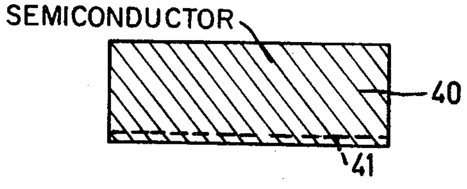
FIGS. 6 and 7 are sectional views of a semiconductor body, the first without a contact layer and the second with a contact layer.
Figure 7:
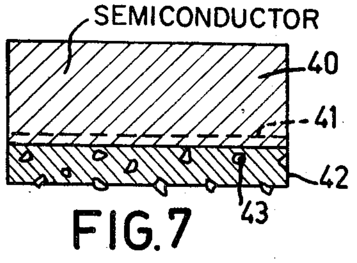

To apply a layer consisting of gold and silicon to a single crystal body of silicon, for example one preferably evaporates in the first place, onto a silicon body 40, a very thin gold layer 41 (FIG. 6) which is baked by heating at approximately 600° C. for some minutes. This layer serves to improve the adhesion of a contact layer 42 (FIG. 7) which may be applied by means of the bath of gold salts previously described and which contains silicon particles 43 (FIG. 7). The body thus obtained may be divided, if desired, into small pieces which may be bonded on a substrate. The presence of silicon in the gold layer facilitates and speeds up the flowing out and the adhesion of the contact layer at a comparatively low temperature; furthermore it also limits the amount of silicon which is dissolved from the body 40 in the layer. The body 40 may preliminarily be provided with determined structures, and comprise, for example, an integrated circuit or a certain number of these circuits.

Similarly a gold contact may be applied in a window formed in an insulating layer covering a semiconductor body in the carrying out of the so-called "planar" process.

Figure 8:
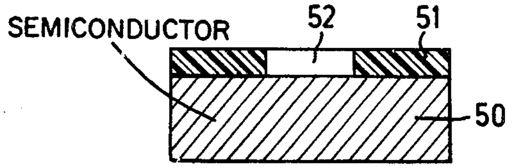
FIGS. 8, 9 and 10 show different stages of the method of applying a contact layer in a window formed in an insulating layer covering a semiconductor body.
Figure 9:
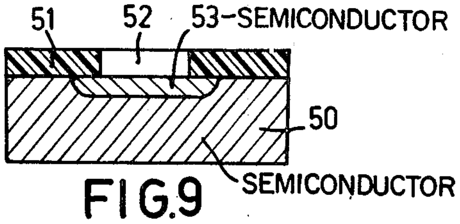

FIG. 8 shows a silicon semiconductor body 50 of the type n which has applied to it in the usual manner a silicon-oxide layer 51 comprising a window 52. By diffusion of boron, the silicon situated beneath the window is caused to form a region 53 of the type p having a depth of, for example, 30 microns (FIG. 9).

Figure 10:
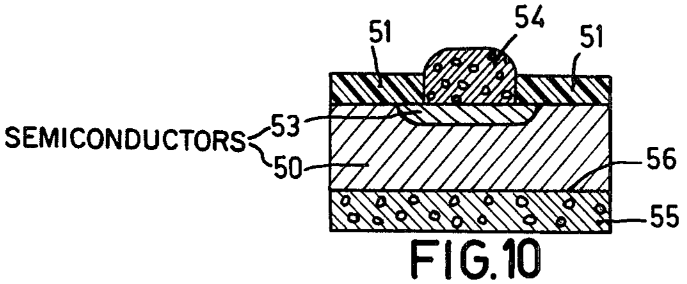

After evaporation of a thin gold layer (not shown) in the window and sintering at approximately 600° C. for several minutes, a gold contact layer 54 containing silicon particles is deposited in the manner already described. The body 50 must then be used as a cathode (FIG. 10). Furthermore, the gold or silicon may be prevented from depositing at undesirable areas by using a masking technique.

In such a case it may be advantageous preliminarily to dope the powdery silicon with boron. An analogous layer 55, but doped with antimony, may be applied to the lower surface 56 of the body. The layers 54 and 55 may be alloyed to the body 50 by brief sintering at 410° C. In this case, it is very important that the gold and silicon alloy 54 which is formed, does not penetrate deep into the very thin region 53. For this purpose, the concentration of semiconductor particles in the metal may be higher than that used in a layer for bonding a semiconductor body on a base (FIG. 4). Since this penetration must be effected very regularly, it may be advantageous that the silicon particles to be deposited in this layer are very small and of uniform size.

Figure 11:
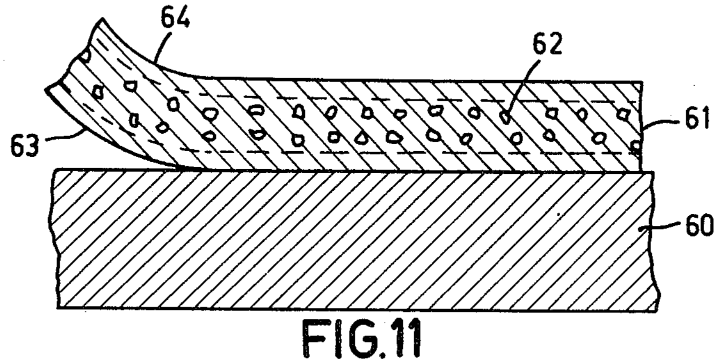
FIG. 11 shows the manner in which a thin contact layer is obtained with the aid of a provisional substrate.

The contact layer may, if necessary, be applied to a provisional or temporary substrate. If the metal is applied by electro-deposition it is possible to utilize for this purpose, as shown diagrammatically in FIG. 11, for example a substrate 60 of stainless polished steel from which, as is well-known, an electrolytic deposit readily loosens. It is also possible to use a glass substrate which has preliminarily been metallized. When using one of the baths previously mentioned, it is possible to apply to this substrate, a contact layer 61 containing particles 62 of semiconductor material. FIG. 11 shows in greater detail a contact layer of which superficial regions 63 and 64, situated on either side of the layer, do not contain particles of semiconductor material, which is obtained by depositing only pure metal at the beginning and at the end of the operation. After having separated the layer 61 in the form of a thin foil from the provisional substrate 60, it may be divided into small discs, strips or wires without difficulty insofar the pure metal is sufficiently ductile. Thus, for example, a contact layer constituted by gold and silicon particles is ductile to such an extent that it may readily be transformed into small discs, whereas it is very difficult to obtain and process a thin layer manufactured of the same materials, but by alloying.

Figure 12:
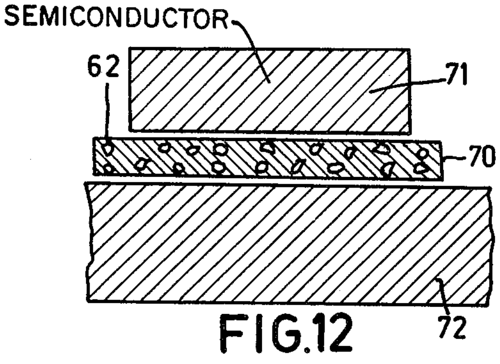
FIGS. 12 and 13 show two stages of a method permitting of bonding a semiconductor body on a base with the aid of a small plate cut out of the thin contact layer shown in FIG. 11.
Figure 13:
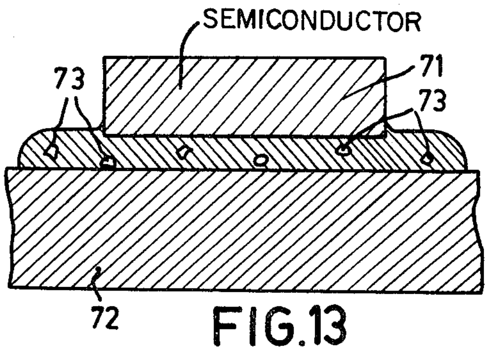

From a thin layer thus obtained it is possible more particularly to punch discs 70 (FIG. 12) which may be placed between a semiconductor body 71 and a base 72 which may subsequently be assembled by heating the whole for a short instant (FIG. 13). In general, numerous particles 62 of semiconductor material present at the beginning are dissolved in the course of this operation or bring about the formation of inclusions 73 constituted by an alloy of gold and silicon.

In the foregoing, contact layers have been considered which are constituted by gold and silicon, since bodies of silicon are, on the one hand, often used in semiconductor devices and, on the other hand, gold is often used as a contact on the silicon as well as for covering certain parts of the envelopes of the substrates of semiconductor bodies, current supply members for the electrodes etc. It will be evident that the invention is not limited to this combination of materials.

Several further examples of combinations of metals and semiconductors are given in the table hereinafter. The temperatures shown between parentheses are the approximate melting points of the elements, the eutectic temperatures being found at the crossings between the rows and the columns.

| | Ag (960° C.) | Al (660° C.) | Au (1,063° C.) | Co (1,495° C.) | Ni (1,453° C.) |
|---|---|---|---|---|---|
| Ge (945° C.), ° C. | 651 | 424 | 356 | 810 | 775 |
| Si (1,415° C.), ° C. | 830 | 577 | 370 | 1,195 | 809 |

Alloys of gold and silver, on the one hand, with germanium or silicon on the other form eutectics distinctly characterized. Aluminium also permits of obtaining alloys having a low melting-point, but this metal—since it is oxidisable—is not equally suitable as the preceding ones for obtaining contact layers. Cobalt and nickel are specified in this table inter alia because of the advantage that they can readily be applied by "electroless" methods.

It should further be noted that it is also possible to combine the contact layer with further layers without passing beyond the scope of the invention. Thus it is possible, for example, to apply a gold layer to a nickel layer obtained by chemical deposition and comprising particles of semiconductor material. Conversely, it is possible more particularly to apply a layer constituted by gold and particles of silicon to a nickel-plated substrate.

Also, it should be noted that the metallic deposition may comprise several metals deposited simultaneously and that the semiconductor particles may originate from several different semiconductor materials.

It will be evident that modifications can be made to the embodiments just described, notably by substitution of equivalent technical means, without passing beyond the scope of the present invention.

What is claimed is:

1. A base for supporting a semiconductor crystal in a semiconductor device comprising a substrate and on the substrate a coherent layer of a metal capable of alloying with the crystal, said metal being selected from the group consisting of gold, silver, aluminum, cobalt and nickel, and distributed uniformly throughout at least the lateral extent of the layer dispersed particles of a semiconductor material capable of alloying with the metal to form a distinctly characterized eutectic containing a substantial quantity of the semiconductor, the quantity of semiconductor material dispersed in the metal layer being at least 0.001% by volume of the metal and at most that corresponding to the formation of the eutectic of the metal and semiconductor.

2. A base as set forth in claim 1 wherein the metal is gold or silver, and the semiconductor particles are of silicon having a size below 5 microns.

3. A ductile metal contact layer for bonding to a semiconductor crystal comprising a coherent layer of a metal capable of alloying with the crystal, said metal being selected from the group consisting of gold, silver, aluminum, cobalt and nickel, and distributed uniformly throughout at least the lateral extent of the layer dispersed fine particles of a semiconductor material capable of alloying with the metal to form a distinctly characterized eutectic containing a substantial quantity of the semiconductor but not alloyed with the metal and in a quantity that is optically visible under an optical microscope at moderate magnification, the quantity of semiconductor material dispersed in the metal layer being at least 0.001% by volume of the metal and at most that corresponding to the formation of the eutectic of the metal and semiconductor.

4. A semiconductor device comprising a semiconductor crystal and bonded to the semiconductor crystal a metal layer forming an alloyed recrystallized region at the junction of the crystal and the metal layer, said metal being selected from the group consisting of gold, silver, aluminum, cobalt and nickel, said metal layer containing beyond the alloyed region and distributed uniformly throughout its lateral extent small inclusions of at least one substance selected from the group consisting of a semiconductor material, a eutectic of the semiconductor material and the metal, and an alloy of the semiconductor material and the metal, the semiconductor material and the metal being capable of forming a distinctly characterized eutectic containing a substantial quantity of the semiconductor, the quantity of semiconductor material dispersed in the metal layer being at least 0.001% by volume of the metal and at most that corresponding to the formation of the eutectic of the metal and semiconductor.

5. A device as set forth in claim 4 wherein the lateral extent of the layer substantially exceeds that of the crystal.

6. A device as set forth in claim 4 wherein the semiconductor crystal is of silicon, germanium or gallium arsenide.

References Cited

UNITED STATES PATENTS

| | | | |
|---|---|---|---|
| 3,179,542 | 4/1965 | Quinn et al. | 148—177 |
| 3,183,407 | 5/1965 | Yasuda et al. | 317—101 |
| 3,184,831 | 5/1965 | Siebertz | 29—155.5 |
| 3,400,006 | 9/1968 | Berning | 117—33.3 |
| 3,400,066 | 9/1968 | Caswell et al. | 204—192 |
| 3,244,557 | 4/1966 | Chiou et al. | 117—212 |
| 3,287,108 | 11/1966 | Hausner | 117—107 XR |
| 3,385,737 | 5/1968 | Dreyfus | 148—1.6 |
| 3,420,704 | 1/1969 | Webb et al. | 117—107 XR |

WILLIAM L. JARVIS, Primary Examiner

U.S. Cl. X.R.

117—117, 212, 215, 217; 317—234; 204—46, 192; 148—171; 29—548

UNITED STATES PATENT OFFICE
CERTIFICATE OF CORRECTION

Patent No. 3,522,087 Dated July 28, 1970

Inventor(s) RODOLPHE LACAL

It is certified that error appears in the above-identified patent and that said Letters Patent are hereby corrected as shown below:

Column 5, line 43, "as certain" should read -- ascertain --.

Column 9, In the Table under Group Ni, "809" should read -- 806 --.

Signed and sealed this 17th day of November, 1970.

(SEAL)
Attest:

Edward M. Fletcher, Jr.
Attesting Officer

WILLIAM E. SCHUYLER, JR.
Commissioner of Patents

FORM PO-1050 (10-69)

USCOMM-DC 60376-P69
★ U.S. GOVERNMENT PRINTING OFFICE : 1969 O—366-334